United States Patent [19]
Ishida

[11] Patent Number: 5,831,878
[45] Date of Patent: Nov. 3, 1998

[54] EXPONENTIAL AND LOGARITHMIC CONVERSION CIRCUIT

[75] Inventor: Ryuji Ishida, Tokyo, Japan

[73] Assignee: NEC Corporation, Tokyo, Japan

[21] Appl. No.: 684,137

[22] Filed: Jul. 19, 1996

[30] Foreign Application Priority Data

Jul. 21, 1995 [JP] Japan .................................. 7-207645

[51] Int. Cl.⁶ .................. G06F 7/00; G06F 1/02
[52] U.S. Cl. ..................... 364/722; 364/715.03
[58] Field of Search .............. 364/715.03, 722, 364/748.5

[56] References Cited

U.S. PATENT DOCUMENTS 4,078,250  3/1978  Windsor et al. .............. 364/715.03
5,301,138  4/1994  Lindsley ........................ 364/748.5
5,524,089  6/1996  Takano .......................... 364/748.5

FOREIGN PATENT DOCUMENTS 61-16331  1/1986  Japan .
63-19037  1/1988  Japan .

*Primary Examiner*—Chuong Dinh Ngo
*Attorney, Agent, or Firm*—Whitham, Curtis & Whitham

[57] ABSTRACT

A signal processor includes a normalization circuit (101, 102, 103, 106, 107, 108) for input data and a conversion table (110). A higher digit portion of mantissa portion after normalization is logarithmically converted by looking up table data stored in the conversion table (110). By shifting a decimal point position of the converted data, exponent data can be used as integer data and added to the converted data so that the conversion process is achieved.

10 Claims, 2 Drawing Sheets

EXPONENTIAL AND LOGARITHMIC CONVERSION CIRCUIT

BACKGROUND OF THE INVENTION

The present invention relates to a signal processing unit of a computer and, in particular, to an exponential and logarithmic conversion circuit thereof.

In a conventional processing unit, a logarithmic or exponential conversion is achieved by performing a table lookup or developing a polynomial for a numeric operation.

In order to perform the numeric operation, an input numerical value for logarithmic conversion is at first divided into an exponent portion and a mantissa portion. Then, these exponent and mantissa portions are logarithmically converted into first and second converted values, respectively. Thereafter, the converted values are added to each other to derive a logarithmic converted value.

Hereinbelow, description will be made as regards a procedure of the logarithmic conversion of a given value X.

Now, providing $X=2^E \times X'$ ($0.55 \leq X' < 1$) and $X''=X'-1$, a natural logarithm of X, $\text{Log}_e X$, is derived by the following approximate expression (1):

$$\begin{aligned}\text{Log}_e X &= \text{Log}_e(2^E \times X') \quad (1)\\ &= \text{Log}_e 2^E + \text{Log}_e X'\\ &= E \times \text{Log}_e 2 + (x' - (x^*)^2/2) + (x^*)^2/3))\end{aligned}$$

In a known method, X is shifted in a barrel shifter leftward by one bit repeatedly until just before the first bit of "1" overflows the shifter. Then, value E is obtained as a number of shifting times, and the shifted value in the shifter is given as X'. Thus, the given value is normalized Accordingly, for performing logarithmic conversion of a value of a, for example, 24-bit length, 24 instruction steps are required at maximum only for the shifting operation.

In order to achieve the logarithmic conversion of each of the divided exponent portion and mantissa portion, it has been also proposed In, for example, Japanese unexamined Patent Application Publication JP-A-63-19037 to use the table lookup method.

On the other hand, the exponential conversion can be achieved in the following fashion. Providing that a conversion object value is given as E, $E=E'+z$ ($E' \leq -0.5$ or $0.5 < E'$, z is an integer) is obtained by the similar but rightward shift operation, and $\exp(E)$ is derived by the following approximate expression (2):

$$\begin{aligned}\exp(E) &= \exp(E' + z) \quad (2)\\ &= \exp(z) \times \exp(E')\\ &= \exp(z) \times (1 + E' + (E')2/2!) + (E')3/3!))\\ &= \exp(z) + \exp(z) \times (2E'(1/2 + E'(1/4 + E'/12)))\end{aligned}$$

In the logarithmic conversion and the exponential conversion achieved by the conventional processing unit, the shifting operation is required for normalizing the conversion object value so that the number of process steps for the conversion is increased.

On the other hand, if a dedicated normalization circuit is provided for avoiding the increment of the number of process steps, a circuit scale of the signal processing unit is largely increased.

Further, the conversion processes are necessary for the integer or exponent portion and the decimal fraction or mantissa portion, respectively, relative to the normalized data. In particular, when deriving the approximate data through the numeric operation, the squared data, the cubic data and the like are required. Thus, even in a DSP (digital signal processor) incorporating a multiplier or the like, there has been a problem that the number of process steps is increased.

On the other hand, in the foregoing JP-A-63-19037, it is necessary to provide the tables for conversion of the exponent portion and for conversion of the mantissa potion, respectively. This increases a hardware amount for the tables. Since two table spaces are required, a control logic circuit for the table spaces is also enlarged. Further, although the logarithmic conversion can be dealt with, the exponential conversion is not. Moreover, if it is necessary to perform conversion into a common logarithm with base 10 and a natural logarithm with base e, respective tables are required.

SUMMARY OF THE INVENTION

Therefore, it is an object of the present invention to provide an improved exponential/logarithmic conversion circuit for a signal procesing unit.

It is another of the present invention to provide a exponential/logarithmic conversion method for data processing.

According to the present invention, there is provided an exponential and logarithmic conversion circuit comprising: normalization means for dividing an input value into exponent portion and mantissa portion to express the input value by the floating-point representation; and conversion table means for receiving the mantissa portion so as to perform a conversion of the mantissa portion through a table lookup.

In the exponential and logarithmic conversion circuit the exponent portion may be allocated at a higher digit part in bit data handled in the circuit, and a decimal point position of a converted value after logarithmic conversion may be located at the lowest digit bit of the exponent portion.

In the circuit, a decimal point position of output data of the conversion table means is set to be same as the decimal point position of the data after the logarithmic conversion, and wherein the exponent portion and the output data of the conversion table means are added to derive a logarithmic conversion result.

In the circuit, a predetermined higher digit bits in the mantissa portion is applied to the conversion table means.

In the circuit, the normalization means comprises weight detecting means for detecting a highest digit in the input value having "1", and shifting means, and wherein an output of the weight detecting means is applied to the shifting means as a shift number performed in the data shifting means.

According to another aspect of the exponential and logarithmic conversion circuit, the exponent portion may also be allocated at a higher digit part in bit data handled in the circuit, and an input value for exponential conversion as the data may be located at the lowest digit bit of the exponent portion.

In the circuit, a decimal fraction portion of the input value for the exponential conversion is applied to the conversion table means, and output data of the conversion table means are shifted by a shift number indicated by an integer portion of the input value for the exponential conversion to produce a shifted value as an exponential conversion result.

In the circuit, a predetermined higher digit bits in the decimal fraction portion is applied to the conversion table means.

According to the present invention, there is provided a conversion method comprising the steps of:

dividing a fixed-point input value into an exponent portion and a mantissa portion;

applying a predetermined higher digit bits in the mantissa portion into a conversion table means to produce a logarithmic value, with base 2, of the mantissa portion;

adding the logarithmic value and the exponent portion with an adjusted decimal point position to produce a sum; and multiplying the sum by a constant corresponding to either one of a common logarithm and a natural logarithm to produce a logarithmically converted value of the input value.

The conversion method may further comprises the steps of:

multiplying the logarithmically converted value by another constant corresponding to either one of the common logarithm and the natural logarithm to produce a conversion value;

shifting the conversion value by a predetermined bit number to produce a decimal fraction portion of the conversion value;

applying a predetermined higher digit bits of the decimal fraction portion to the table conversion means to produce a converted output value; and shifting the converted output by a shift number represented by an integer portion of the higher digit bits of the conversion value to produce a shifted value as an exponentially converted value.

In the conversion method, the shift number may be produced by adding "1" to the integer portion, and a most significant bit of the predetermined higher digit bits of the decimal fraction portion is set to "1" and than applied to the conversion table means, and wherein each of data stored in the conversion table means is set to be reduced by half.

DESCRIPTION OF THE PREFERRED EMBODIMENT

In order to facilitate understanding of the present invention, a known signal processor including a computing unit used for the exponential and logarithmic conversion will be first explained hereinbelow with reference to FIG. 1.

Figure 1:
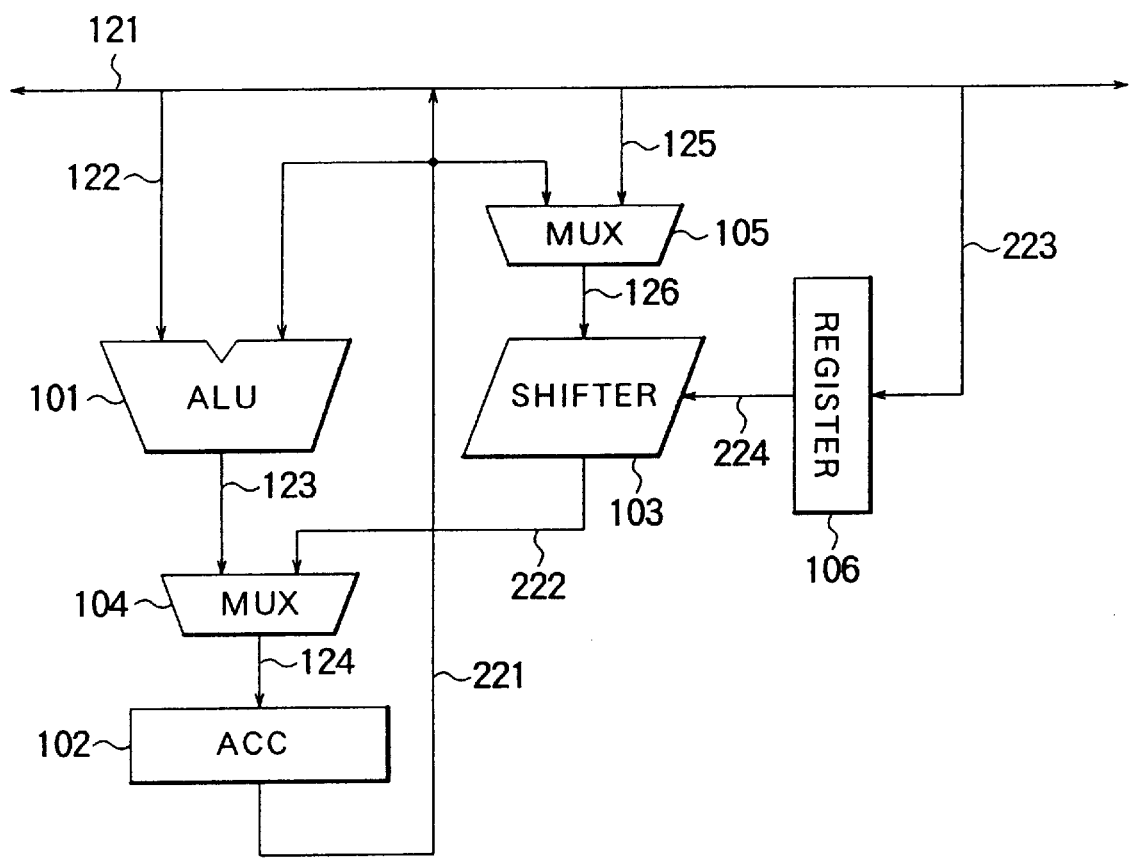
FIG. 1 is a block diagram showing a known structure of a computing unit in a digital signal processor.

In FIG. 1, the signal processor includes an arithmetic logic unit (ALU) 101, an accumulator (ACC) 102, a shifter or a shifting circuit 103, a register 106, multiplexers (MUX's) 104 and 105, an internal data bus 121, and data lines 122 to 126 and 221 to 224.

The ALU 101 performs calculation of 24-bit input data and outputs 24-bit data. The ALU 101 has one input port connected to the data line 122, another input port connected to the data line 221 and an output port connected to the data line 123.

The ACC 102 is a 24 bit width register for storing data as the result of calculation. The ACC 102 has an input port connected to the data line 124 and an output port connected to the data line 221.

The shifter 103 is a barrel shifter which performs 24-bit shifts either to the left or right. The shifter 103 has a data input port connected to the data line 126, a shift number input port connected to the data line 224 and an output port connected to the data line 222.

The register 106 is a 6-bit register for holding a shift number performed at the shifter 103. The register 106 has an input port connected to the data line 223 and an output port connected to the data line 224.

The MUX 104 has one input port connected to the data line 123, another input port connected to the data line 222 and an output port connected to the data line 124.

The MUX 105 has one input port connected to the data line 125, another input port connected to the data line 221 and an output port connected to the data line 126.

The data lines 122, 125, 221 and 223 are connected to the internal data bus 121.

Data indicative of the shift number at the shifter 103 are allocated at higher six digit parts of the data bus 121, and the data line 223 connected to the input port of the register 106 receives the six bits of the higher digits from the data bus 121.

Although not shown in FIG. 1, the signal processor further includes various peripheral blocks, such as an instruction memory, a control block, a data RAM, a multiplier and input/output ports.

In the known computing unit, the normalizing operation of the input data or value is performed by use of the shifter 103 and register 106 in which a shift number "1" is set together with a shifting instruction. The shifting operation is repeated until the first bit of "1" overflows. However, there is a problem described in the preamble of the description.

Now, a preferred embodiment of the present invention will be described hereinbelow with reference to FIG. 2.

Figure 2:
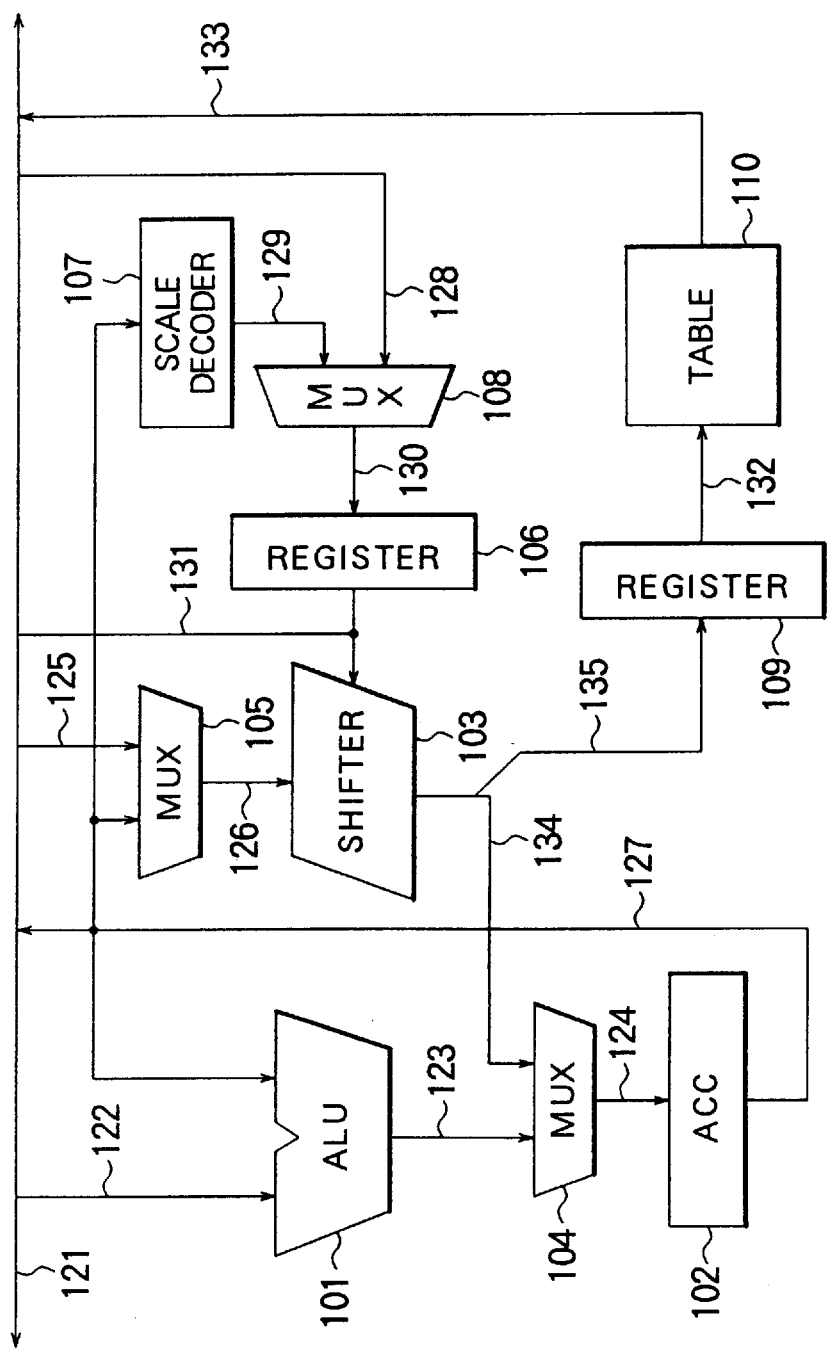
FIG. 2 is a block diagram showing a structure of a computing unit for an exponential and logarithmic conversion according to one embodiment of this invention which is used in a signal processor.

In FIG. 2, the signal processor includes an arithmetic logic unit (ALU) 101, and accumulator (ACC) 102, a shifter or a shifting circuit 103, registers 106 and 109, multiplexers (MUX's) 104, 105 and 108, a scale decoder, that is, a most significant bit (MSB) detecting circuit 107, an exponential and logarithmic table 110, an internal data bus 121, data lines 122 to 135.

The ALU 101 performs calculation of 24-bit input data and outputs 24-bit data. The ALU 101 has one input port connected to the data line 122, another input port connected to the data line 127 and an output port connected to the data line 123.

The ACC 102 is a 24 bit register for storing data as the result of calculation. The ACC 102 has an input port connected to the data line 124 and an output port connected to the data line 127.

The shifter 103 is a barrel shifter which performs 24-bit shifts either to the left or right. The shifter 103 has an input port connected to the data line 126, a shift number input port connected to the data line 131 and an output port connected to the data line 134.

The register 106 is a 6 bit register for holding a shift number of the shifter 103. The register 106 has an input port connected to the data line 127 and an output port connected to the data line 131.

The register 109 is an 8 bit register for holding a table address of the exponential and logarithmic table 110. The register 109 has an input port connected to the data line 135 and an output port connected to the data line 132.

The scale decoder 107 is a circuit for detecting the first bit position or digit of the inputted 24-bit data where "1" is firstly present along the digits of the input data. The scale decoder 107 has an input port connected to the data line 107 and an output port connected to the data line 129.

The exponential and logarithmic table 110 stores 128 words for each of the exponential conversion and the logarithmic conversion, which can be accessed by data in the register 109 as a table address. The table 110 has a table address input port connected to the data line 132 and an output port connected to the data line 133.

The MUX 104 has one input port connected to the data line 123, another input port connected to the data line 134 and an output port connected to the data line 124.

The MUX 105 has one input port connected to the data line 125, another input port connected to the data line 127 and an output port connected to the data line 126.

The MUX 108 has one input port connected to the data line 128, another input port connected to the data line 129 and an output port connected to the data line 130.

The data lines 122, 125, 127 and 133 are connected to the internal data bus 121.

Among the 24 bits on the data line 134, the 8 bits of higher digits are connected to the data line 135.

Data indicative of the shift number of the shifter 103 is allocated at the higher digit part of the data bus 121, and the data lines 131 and 128 are connected to the 6 bits at higher digit part of the data bus 121.

Although not shown in FIG. 2, the signal processor further includes various peripheral blocks, such as an instruction memory, a control block, a data RAM, a multiplier and input/output ports.

First, an operation upon execution of a normal data calculation (calculation other than exponential or logarithmic conversion) will be described.

When performing the normal data calculation, data to be processed are supplied to the data line 122 via the data bus 121 from the data RAM or the like.

The ALU 101 performs an arithmetic logic operation for the data supplied via the data lines 122 and 127 and outputs the calculation result to the data line 124, according to a control signal from the control block.

The MUX 104, according to a control signal, outputs the data from the data line 123 to the data line 124 so that the calculation result is stored in the ACC 102.

When performing the shifting operation, data indicative of a shift amount are stored in the register 106 via the data line 128, the MUX 108 and the data line 130.

The data sent from the ACC 102 via the data line 127 or the data sent from the data RAM or the like via the data line 125 are applied into the shifter 103 via the MUX 105, so as to be shifted based on the shift number data held at the register 106. The shifted data are stored in the ACC 102 via the data line 134.

By repeating the foregoing processes, the normal data calculation is achieved.

Now, an operation upon performing the exponential conversion or the logarithmic conversion will be described.

When performing the logarithmic conversion, an input value is applied to the ALU 101 through the data line 121 and is then into ACC 102 through the MUX 104 after being subjected to a predetermined calculation at the ALU 101. The data held at the ACC 102 are first applied into the scale decoder (normalizing circuit) 107 via the data line 127. Output data of the scale decoder 107 are stored in the register 106.

The data held at the ACC 102 are also supplied into the shifter 103 via the MUX 105 and the data line 126 so as to be shifted based on the shift number data held at the register 106. The shifted data are then outputted onto the data line 134. Among the outputted shifted data, the 8 bits of higher digits are stored in the register 109 via the data line 135.

Thus, normalization of the input value or input data are performed by ALU 101, ACC 102, shifter 103, register 106, scale decoder 107, and a multiplexer 108.

Further, the data held at the register 106 are written in the ACC 102 via the data bus 121 and the ALU 101, and an inverse number thereof is calculated.

The table 110 transfers 24-bit data at an address indicated in the address data stored in the register 109 to the ALU 101 via the data bus 121, and the transferred 24-bit data are, at the ALU 101, added to data which has been inverted in sign at the ACC 102 in advance.

On the other hand, when performing the exponential conversion, the data held at the ACC 102 are shifted by 5 bits to the right at the shifter 103. Higher digit 8 bits of output data from the shifter 103 are applied, as a table address, to the register 109 via the data line 135. Simultaneously, data obtained by adding "−1" to higher digit 6 bits of the data held at the ACC 102 are transferred to the register 106.

By inputting the output of the table 110 into the shifter 103 via the data bus 121, the data line 125, the MUX 105 and the data line 126 and shifting the inputted data to the left according to the data held at the register 106, the exponential conversion can be achieved.

Hereinbelow, the conversion operation will be further described using actual data.

First, the conversion to a logarithm with base 10 (e in case of a natural logarithm) will be explained with respect to a binary number. The numeric value for conversion is set to be a 24-bit signed number in the fixed-point representation.

When performing logarithmic conversion for the value X (>0), the following conversion identified by an equation (3) is first performed:

$$\text{Log}_e X = (\text{Log}_2 X)/(\text{Log}_2 10) \qquad (3)$$
$$= (1/\text{LOG}_2 10) \times (\text{Log}_2 X)$$

In the equation (3), since $1/\text{Log}_2 10$ is a fixed value, $\text{Log}_{10} X$ is derived by multiplying $1/\text{Log}_2 10$ by $\text{Log}_2 X$, using the multiplier, after deriving $\text{Log}_2 X$. Then, $\text{Log}_2 X$ is transformed as identified by the following equation (4):

$$\text{Log}_2 X = \text{Log}_2(2^E \times X') \qquad (4)$$
$$= \text{Log}_2 2^E + \text{Log}_2 X'$$
$$= E + \text{Log}_2 X'$$

According to the equation (4), the leftward shifting operation is performed for X in the shifter 103 until a first bit in the data X having "1" is shifter to a second bit position (bit next to MSB) in the shifter 103. Then, the shift number is E and the data in the shifter 103 after shifted is X' (0≦X'<1). E and a logarithmic converted value of mantissa data X' are added to each other at ALU 101, and logarithmic conversion of X can be achieved.

In this preferred embodiment, the logarithmic conversion of the mantissa data X' is performed by the table lookup so as to achieve the high-speed conversion. As described before, the table 110 stores 128 words for the logarithmic conversion. As the address data for accessing the table data, the higher digit 8 bits (MSB is fixed to "0" of the mantissa data X' are used. In practice, the table includes 256 words, a 128 word portion and the remaining 128 word portion thereof are used for a logarithmic conversion table and an exponential conversion table, respectively.

In the conversion process of the 24-bit data, the maximum shift amount is 23 to the left, and the data after conversion of X' is given by the following equation (5):

$$-8 \leq Log_2 X' < -1 \qquad (5)$$

Thus, the data after conversion of X is given by the following equation (6):

$$-23 - 8 \leq Log_2 X < 0 - 1 \qquad (6)$$
$$-31 \leq Log_2 X < -1$$

Accordingly, it is necessary to handle the logarithmic converted data by shifting a decimal point thereof by 5 bits to the right in advance. Following this, decimal points of the conversion data stored in the table 110 are also shifted by 5 bits to the right in advance.

Now, the exponential conversion will be described with respect to a binary number.

After a particular process is applied to the logarithmic converted data obtained in the foregoing manner, the logarithmic converted data may be exponentially converted to bring the data back to a linear region. In this case, the conversion as identified by an equation (7) is performed If data M ($-32 < M < 0$) for exponential conversion are given by $M=M'+z$ ($0 \leq M' < 1$), $2^M$ is transformed as identified by the following equation (7):

$$\begin{aligned} 2^M &= 2^{(M'+z)} \\ &= 2^z \times 2^{M'} \end{aligned} \qquad (7)$$

In the equation (7), z is an integer portion (higher digit 6 bits) and represents a shift amount to the right ($-32 < z \leq -1$), and $2^{M'}$ takes a value in the range of $1 \leq 2^{M'} < 2$.

Accordingly, in order to achieve $0 \leq 2^{M'} < 1$ in the table lookup data, "1" is added to the shift amount z and each of the table data is set to be reduced by half.

In order to perform the table lookup, the data M are shifted by 5 bits to the left in the shifter 103 and the MSB is forcibly set to "1", and the higher digit 8 bits in total are stored in the register 109 and used as a table address for the table 110. Then, the table output data is applied into the shifter 103 and is shifted to the right in the shifter 103 by a shift number indicated by a value obtained by adding "1" to a value (z) of the higher digit 6 bits of the data M, the exponential conversion is achieved.

By forcibly setting the MSB to "1" upon the table lookup, the logarithmic conversion table and the exponential conversion table can be defined by a same address space table of 256 words so that lower address 128 words can be used as the logarithmic conversion table and higher address 128 words can be used as the exponential conversion table.

For simplification, 24-bit fixed-point data "000100H (hexadecimal notation)" is assumed as input data for logarithmic conversion. The MSB of the 24-bit data is used a sign bit (for example, "1" represents a negative value).

As appreciated, 14-bit shifts to the left are necessary until "1" comes to a position next to the MSB, that is, until the shifted data becomes "40000H". In this case, although an output of the scale decoder 107 becomes a positive value of 14 due to the leftward shifts, exponent data E becomes -14 by inverting a sign thereof.

Further, since X' obtained by shifting the input data "000100H" to the left by 14 bits becomes X'="400000H", a logarithm of the mantissa data becomes $Log_2 X' = Log_2 2^{-1} - 1 = -1$.

The integer "14" is expressed as "1110B" in the unsigned binary notation. On the other hand, when a decimal point thereof in the 24-bit fixed-point notation is shifted by 5 bits to the right from between the MSB and the bit next to the MSB, it becomes "380000H". If a sign inversion is performed (deriving a complement of 2) relative to "380000H", E="c80000H".

Similarly, the output of the table 110 is set to a state where a decimal point in the 24-bit fixed-point notation is shifted by 5 bits to the right from between the MSB and the bit next to the MSB. Accordingly, the table output "−1" to set to "fc0000H" so that the sum of "c0000H" and the exponent data E (="c80000H") becomes "c40000H" (=−15).

By multiplying this value by $1/Log_2 10$ (=0.30102996) using the multiplier, the logarithmic conversion is completed.

On the other hand, when performing the natural logarithmic conversion, it can be achieved by multiplying "c40000H" (=−15) by $1/Log_2 e$ (=0.693147181), instead of $1/Log_2 10$, using the multiplier.

On the contrary, in case of the exponential conversion, data to be converted is first multiplied by $Log_2 10$ or $Log_2 e$, and calculation is performed relative to the multiplied data.

Now, consideration is given to data "c40000H" obtained by multiplying data to be converted by $Log_2 10$ or $Log_2 e$. The higher digit 6-bit data of "c40000H" represents "31H" (=−15), and hence, by adding "1" thereto, "32H" (=−14) is given.

Further, data obtained by shifting "c40000H" to the left by 5 bits becomes "800000H". Accordingly, by taking the higher digit 8 bits and forcibly setting the MSB to "1", the table lookup address 8 bits) becomes "80H".

Since $2^0=1$ and the table data is set to be reduced by half in advance, an output of the table 110 becomes "400000H" (=−0.5). By shifting the data "400000H" by the shift amount "32H" (14-bit shifts to the right), output data of the shifter 103 becomes "000100H", and thus the exponential conversion is completed.

As described above, according to the preferred embodiment of the present invention, although the normalization circuit for the input data is provided, the existent shifting circuit can be used for a portion of the normalization circuit which performs the data shifting operation. Thus, the increment of the circuit scale is suppressed only to the addition of the scale decoder. Further, the instruction cycle for the shifting operation can be suppressed only to one cycle.

Moreover, in the foregoing preferred embodiment, the decimal point position of the data after logarithmic conversion or the data for exponential conversion is temporarily shifted from the decimal point position of the normal data. With this arrangement, the exponent data of the normalized data an be used as the integer data and the conversion of the exponent data can be rendered unnecessary. Specifically, the required conversion is achieved by converting the mantissa data through the lookup of the table data whose decimal point positions are shifted in advance and adding the converted mantissa data to the exponent data. This reduces the number of signal processing cycles and the table data amount so that the internal hardware can be reduced.

Further, by multiplying the converted data by $1/Log_2 10$ or $1/Log_2 e$, the conversion can be achieved through the same process either in common logarithmic conversion or natural logarithmic conversion.

Accordingly, as compared with the prior art shown in the foregoing JP-A-63-19037 or the like, the number of the tables can be reduced, and further the increment of the logic circuit for the table lookup can be suppressed because one table space is enough for the logarithmic and exponential conversion.

While the present invention has been described in terms of the preferred embodiment, the invention is not to be limited thereto, but can be embodied in various ways without departing from the principle of the invention as defined in the appended claims.

What is claimed is:

1. A conversion method comprising the steps of:

dividing a fixed-point input value into an exponent portion and a mantissa portion;

applying predetermined higher digit bits in said mantissa portion into a conversion table means to produce a logarithmic value, with base 2, of said mantissa portion;

adding said logarithmic value and said exponent portion with an adjusted decimal point position to produce a sum;

multiplying said sum by a constant corresponding to either one of a common logarithm and a natural logarithm to produce a logarithmically converted value of said input value;

multiplying said logarithmically converted value by another constant corresponding to either one of the common logarithm and the natural logarithm to produce a conversion value;

shifting said conversion value by a predetermined bit number to produce a decimal fraction portion of the conversion value;

applying a predetermined higher digit bits of said decimal fraction portion to said table conversion means to produce a converted output value; and shifting said converted output by a shift number represented by an integer portion of the higher digit bits of said conversion value to produce a shifted value as an exponentially converted value, wherein said shift number is produced by adding "1" to said integer portion, and a most significant bit of said predetermined higher digit bits of said decimal fraction portion is set to "1" and then applied to said conversion table means, and wherein each of data stored in said conversion table means is set to be reduced by half.

2. A logarithmic and exponential conversion circuit, comprising:

an arithmetic logic unit (ALU) connected between a data bus and a first multiplexer;

an accumulator for holding an output from said first multiplexer and feeding said output back to said data bus and to said ALU;

a scale decoder connected to receive said output from said accumulator;

a second multiplexer to connect one of said data bus and an output of said scale decoder to a first register for storing a shift number;

a shifter for shifting a data from one of said accumulator and said data bus according to said shift number stored in said first register; and a second register for receiving the most significant bits from said shifter and using said most significant bits as an address for a mathematical look up table, an output of which is supplied to the ALU via said data bus.

3. A logarithmic and exponential conversion circuit as recited in claim 2 wherein said mathematic lookup table comprises a logarithmic conversion table.

4. A logarithmic and exponential conversion circuit as recited in claim 2 wherein said mathematic lookup table comprises an exponential conversion table.

5. A logarithmic and exponential conversion circuit as recited in claim 3 wherein said mathematic lookup table comprises a base 2 logarithmic conversion table.

6. A logarithmic and exponential conversion circuit as recited in claim 3 wherein said mathematic lookup table comprises a base 10 logarithmic conversion table.

7. A logarithmic and exponential conversion circuit as recited in claim 3 wherein said mathematic lookup table comprises a base e logarithmic conversion table.

8. A logarithmic and exponential conversion circuit as recited in claim 3 wherein said scale decoder detects most significant bits (MSB) from said data bus and applies said MSB to said shifter to normalize data in said shifter.

9. A logarithmic and exponential conversion circuit as recited in claim 3 wherein a normalized value output from said shifter is input to said first multiplexer.

10. A logarithmic and exponential conversion circuit as recited in claim 2 wherein said second register receives eight most significant bits from said shifter for said address for said mathematical look up table.

* * * * *